United States Patent [19]
Garth

[11] Patent Number: 6,024,587
[45] Date of Patent: Feb. 15, 2000

[54] HIGH SPEED CIRCUIT INTERCONNECTION APPARATUS

[76] Inventor: Emory C. Garth, 1111 W. 12th St., No. 108, Austin, Tex. 78703

[*] Notice: This patent issued on a continued prosecution application filed under 37 CFR 1.53(d), and is subject to the twenty year patent term provisions of 35 U.S.C. 154(a)(2).

[21] Appl. No.: 08/882,878

[22] Filed: Jun. 26, 1997

[51] Int. Cl.⁷ ........................................................ H01R 4/66
[52] U.S. Cl. .............................................................. 439/101
[58] Field of Search ..................... 439/108, 101, 439/59, 60, 637, 515, 862

[56] References Cited

U.S. PATENT DOCUMENTS

| | | | |
|---|---|---|---|
| 4,362,353 | 12/1982 | Cobaugh et al. | 439/515 |
| 4,420,215 | 12/1983 | Tengler | 439/862 |
| 4,940,432 | 7/1990 | Consoli et al. | 439/862 |
| 4,941,832 | 7/1990 | Korsunsky et al. | 439/515 |
| 5,040,999 | 8/1991 | Collier | 439/108 |
| 5,419,708 | 5/1995 | Koss et al. | 439/637 |
| 5,433,618 | 7/1995 | Morlion et al. | 439/108 |

*Primary Examiner*—Gary Paumen
*Attorney, Agent, or Firm*—Clark, Thomas & Winters, A Professional Corporation

[57] ABSTRACT

A high speed circuit interconnection apparatus involves an electrical connection assembly between a multilayer printed circuit board (PCB) and a connector for receiving the PCB. The PCB has a plurality of logic signal lines and a plurality of power and ground lines, each of the logic signal lines terminating in a contact tab, the PCB having a contacting edge with power and ground conductors affixed thereto, electrically connected to the power and ground lines. The logic and power and ground lines are positioned to provide a desired transmission line impedance. The connector has a plurality of logic contactors, each firmly contacted by a corresponding contact tab when the PCB is inserted, closing a secondary contact. The secondary contact is made at a point on the logic contactor to minimize the length of each logic signal path made up of the corresponding contact tab and the corresponding contactor. The connector further has a plurality of power and ground contactors for electrically connecting to the power and ground conductors, the power and ground contactors each being configured to firmly contact the power and ground conductors at a point to minimize the length of each of the power and ground signal return paths formed by the power and ground conductors and each corresponding power and ground contactor. This plurality of power and ground contactors provides power supply voltages at required high current levels. The logic contactors and the power and ground contactors are positioned on the connector to minimize the distance between the logic current paths and the power and ground signal return paths when the PCB is inserted into the connector to approximately maintain the desired transmission line impedance.

13 Claims, 7 Drawing Sheets

Microstrip

Embedded Microstrip

Stripline

Dual Stripline

*Fig 6*

HIGH SPEED CIRCUIT INTERCONNECTION APPARATUS

BACKGROUND OF THE INVENTION

1. Field of the Invention

This invention relates to interconnections made between a multilayer printed circuit board (PCB) and a connector. More particularly, it relates to a PCB-connector combination for establishing firm contacts, continuing adequate control of signal line characteristic impedance, and minimizing the length of signal paths to maintain the integrity of high speed logic signals and for establishing circuits to provide supply voltages at required current levels.

2. Description of the Related Art

Historically, the interconnection of digital integrated circuits has not been a significant engineering challenge since circuit switching speeds (signal transition times) have been slow when compared to the length of time required for signals to propagate down a typical printed circuit line. However, with the ever increasing circuit speeds associated with current day integrated circuits and related computer system technology, there is a growing need to design and fabricate PCBs using materials with closely controlled electrical characteristics and physical dimensions to achieve adequate control of signal integrity. The extent to which control must be exercised depends on the interconnect length of the PCB lines as compared to the output circuit's switching speed. Printed circuit interconnections begin to take on transmission line characteristics when the signal propagation time equals one half of the signal transition time. Although multiple rules apply when designing high speed interconnect systems, the technology is well known having been reduced to practice in large scale commercial computers more than 30 years ago.

The capability to provide power supply voltages at the required current levels is typically achieved through the use of a few heavy current contacts or multiple lower capacity contacts.

Continual advancements in integrated circuit packaging in multilayer printed circuit board technology, concurrent with the development of higher speed integrated circuits, has provided a means to build high performance computers on individual printed circuit boards. However, ongoing requirements for high performance systems such as large mainframe and multiple parallel processor computers, and telecommunication switches continue the need for multiple PCB logic cards that require interconnection through a printed circuit backpanel. The same considerations affect transmission lines routed between logic cards and backpanels. These systems typically involve one nanosecond and faster circuit switching times requiring closely controlled transmission line interconnections. The entire interconnection system must be designed and fabricated to tighter specifications to minimize signal integrity problems due to reflections and cross coupling.

An optimum PCB logic card to backpanel interface design includes a logic card connector that achieves minimum physical spacing between the connector edge of the logic card and the backpanel to minimize the length of marginally controlled signal line characteristic impedance. Commonly used designs involve relatively large pin and socket connectors with multiple pins devoted to power and ground strategically located alongside signal pins. This results in a marginal solution that is even more marginal for sub nanosecond circuits. Close control of all dimensions and associated tolerances for the PCB, connector, backpanel, and chassis is essential to the proper functioning of the PCB to backpanel interface because of the small physical dimensions of the two separate connector contact designs. Table I lists dimensions and tolerances available per the major PCB manufacturers.

TABLE 1

Controlled Impedance Multi-layer Printed Circuit Board Process Limits

Line width and spacing - down to 0.003 inch
Drill hole diameters - down to 0.008 inch
Thickness to hole diameter plating ratio - up to 16 to 1
Dielectric core thickness - down to 0.002 inch
Starting copper weights (thicknesses) - ¼ ounce (0.00035 inch) to 5 ounce (0.007 inch)
Fine pitch SMT pads - down to 0.008 inch pitch
Via types -     Blind (controlled depth drilled or sequentially processed, 1:1 aspect ratio)
                Buried
                Tagged
                Via in pad
Buried resistors
Buried capacitance
Metalization -  SMOBC/HASL
                Fused tin-lead
                Selective solder strip (TAB)
                Deep tank hard gold
                Deep tank soft-wire bondable gold
                Deep tank gold flashing
Bare copper finish - (Entek-Plus organic coating)
Finished PCB thickness tolerance - 10% down to 5%
Maximum PCB size - up to 28 inch by 24 inch process panels
Electrical -    Standard single fixture (through hole, S/S surface mount)
                Clamshell D/S double density simultaneous test
                Fixtureless (flying probe test, D/S simultaneous test)

Figure 6:
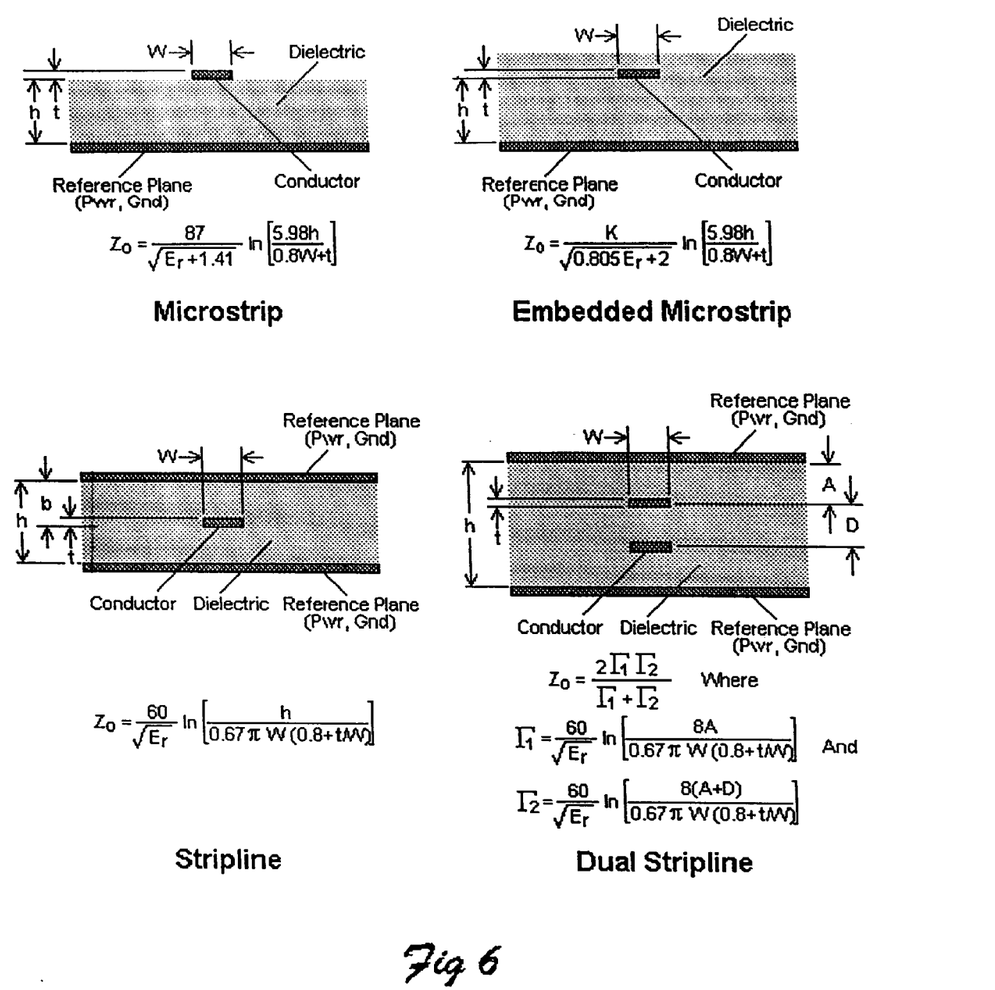
FIG. 6, a chart setting out microstrip and strip line intrinsic impedance.

The present invention provides unique enhancements to the well established card edge connector concept. These enhancements provide significant advantages over the previously described pin and socket solution. Furthermore, microstrip and strip line requirements must be met to achieve 50 ohm impedance transmission lines which are typically employed. The formulas for impedance are shown in FIG. 6.

The microstrip and strip line design requirements are required for both the PCB and backpanel. Also required are plated through hole (PTH) connections between connector contacts and buried signal lines located at the edge of the PCB near the signal contact points. This invention embodies all of these requirements and in addition employs a unique contact design described below.

BRIEF SUMMARY OF THE INVENTION

This invention retains the integrity of high speed signals passing through a connector assembly. In this preferred embodiment, a multilayer printed circuit board (PCB) is inserted into a connector for transmission of signals to a backplane (or substrate).

The high speed logic signals are conducted through logic signal lines in the PCB, each terminating in a contact tab. The connector has logic contactors for electrically contacting the contact tabs, and being made of a spring contact alloy so that the logic contactors deform upon insertion of the PCB into the connector, causing a firm contact and closing a secondary contact. The secondary contact is made at a point on the logic contactor to minimize the length of the logic signal path formed by the contact tab and the contactor.

In addition, the power and ground connections are firmly made with minimum signal return path lengths. The PCB has a card edge to which is attached power and ground conductors. Power and ground lines in the PCB are attached to the power and ground conductors affixed to the contacting edge. One conductor receives ground connections and another conductor receives power connections.

When the PCB is inserted into the connector, the power and ground conductors firmly join power and ground contactors in the connector, the power and ground contactors being made of a spring contact alloy and being configured to firmly contact the power and ground conductors at a point to minimize the length of the power and ground signal return paths formed by the power and ground conductors and the power and ground contactors.

This combination of high speed logic signal contacts together with the power and ground contacts, coupled with the dimensional requirements of the microstrip and strip line design results in an assembly that enables the passage of the high speed signals without appreciable degradation. The desired transmission line impedance established in the PCB by the distances between the logic signal lines and the power and ground lines is approximately maintained in the connector as well.

The principal object of this invention is to enable the transmission of high speed digital signals from an electrical circuit, through a connector assembly to another electrical circuit without significant degradation of the signal.

Another object of this invention is to provide power and ground voltages at the required current levels without the need for additional connector contacts.

This and other objects will be made evident in the detailed description that follows.

DETAILED DESCRIPTION OF THE INVENTION

This invention relates to transmission of high speed digital signals through a novel connector to (in this preferred embodiment) a multilayer backpanel. The high speed digital signals are not significantly degraded through this transmission. This result is achieved by way of the novel concepts set out below in detail.

Figure 1:
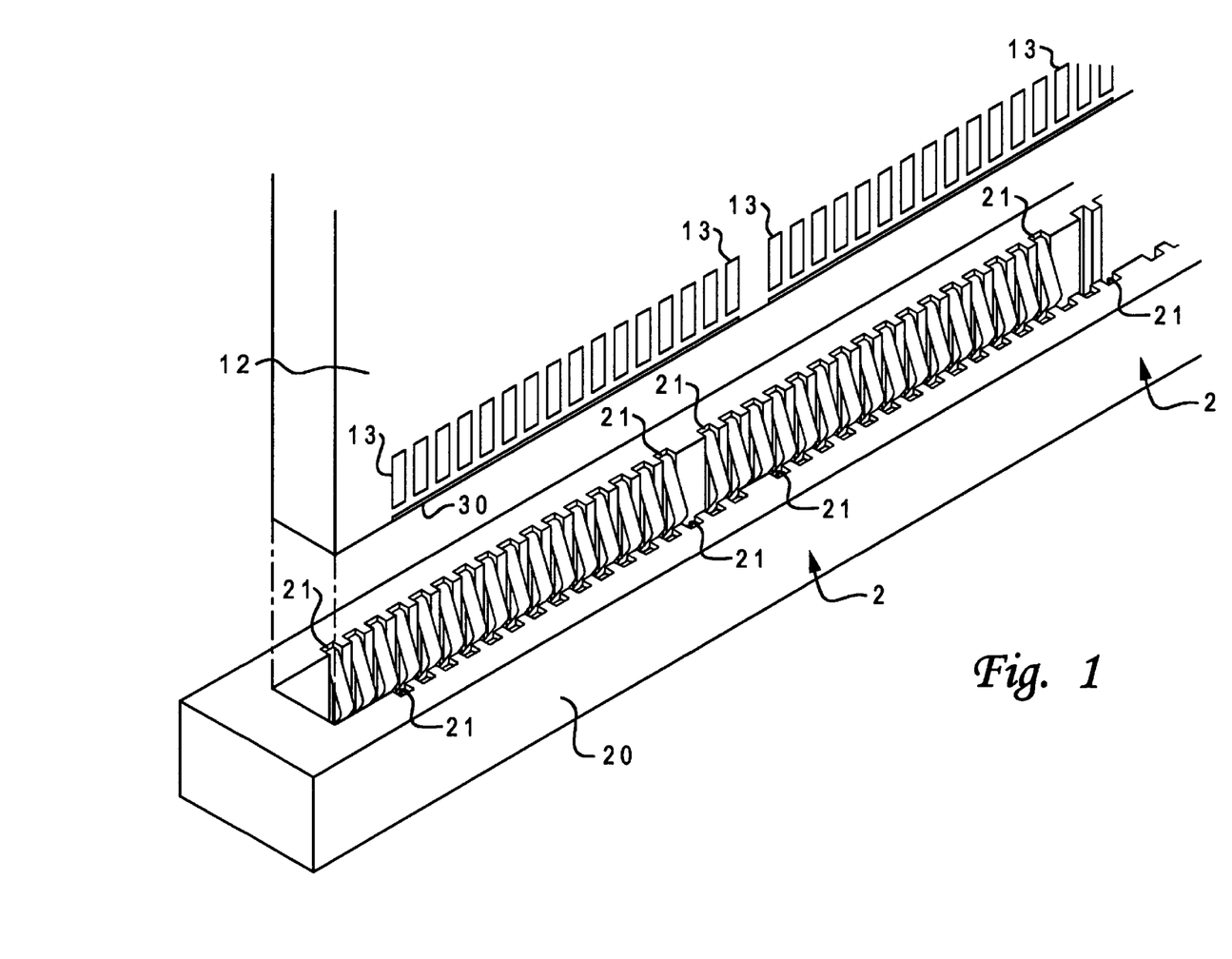
FIG. 1 is a perspective view of a portion of a logic card and connector of this invention.

FIG. 1 illustrates multilayer printed circuit board (PCB) 12 having contact tabs 13 and power and ground conductors 30 fixed to contacting edge 29.

Connector 20 is shown with logic contactors 21 for contacting contact tabs 13. Contact tabs 13 are also present on the other side of PCB 12 and are not visible from the angle shown.

Figure 2:
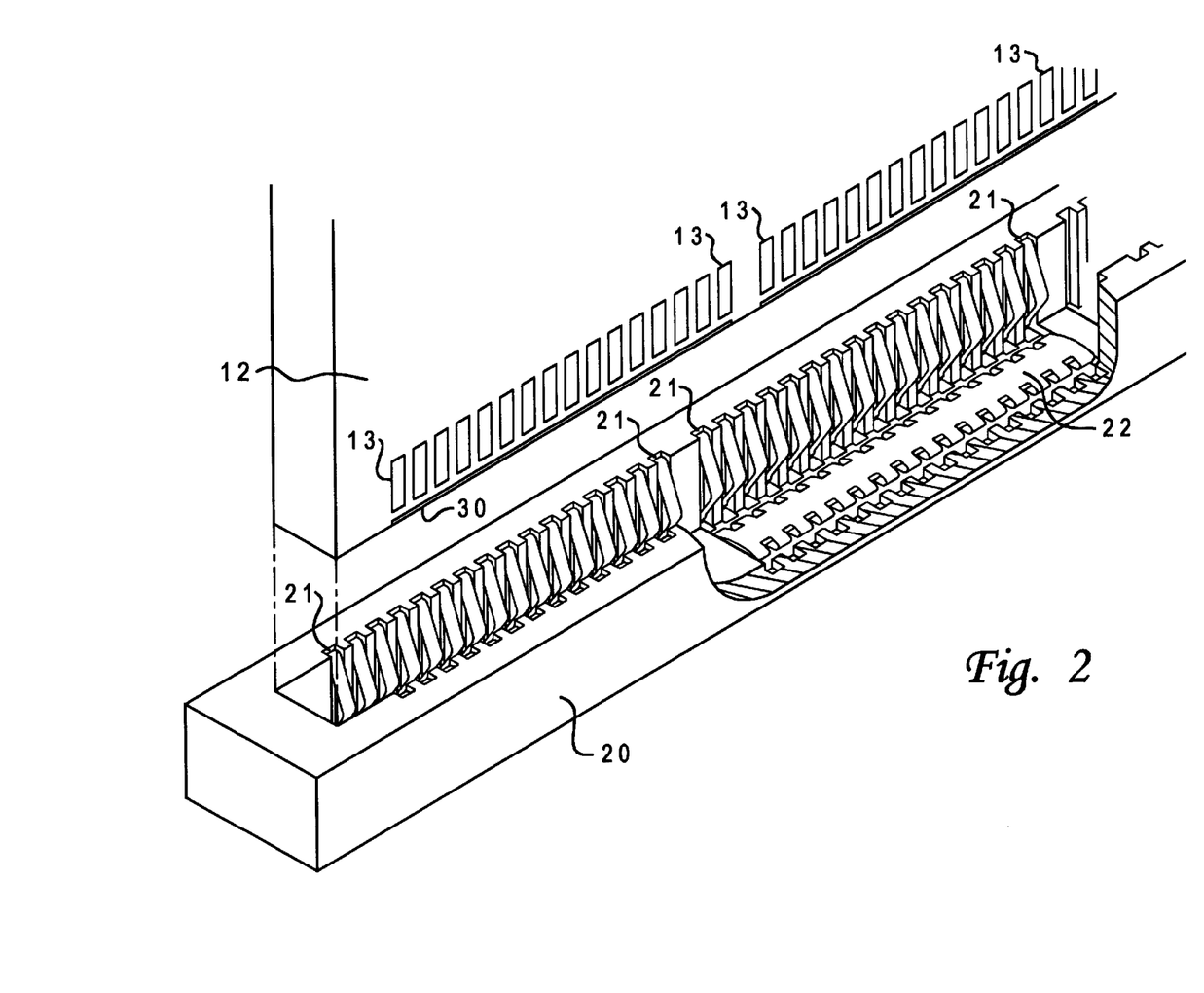
FIG. 2 is a partial section of the connector shown in FIG. 1.

FIG. 2 is a repeat of FIG. 1 but further has a section removed from FIG. 1 to reveal a power or ground contactor 22.

Figure 3:
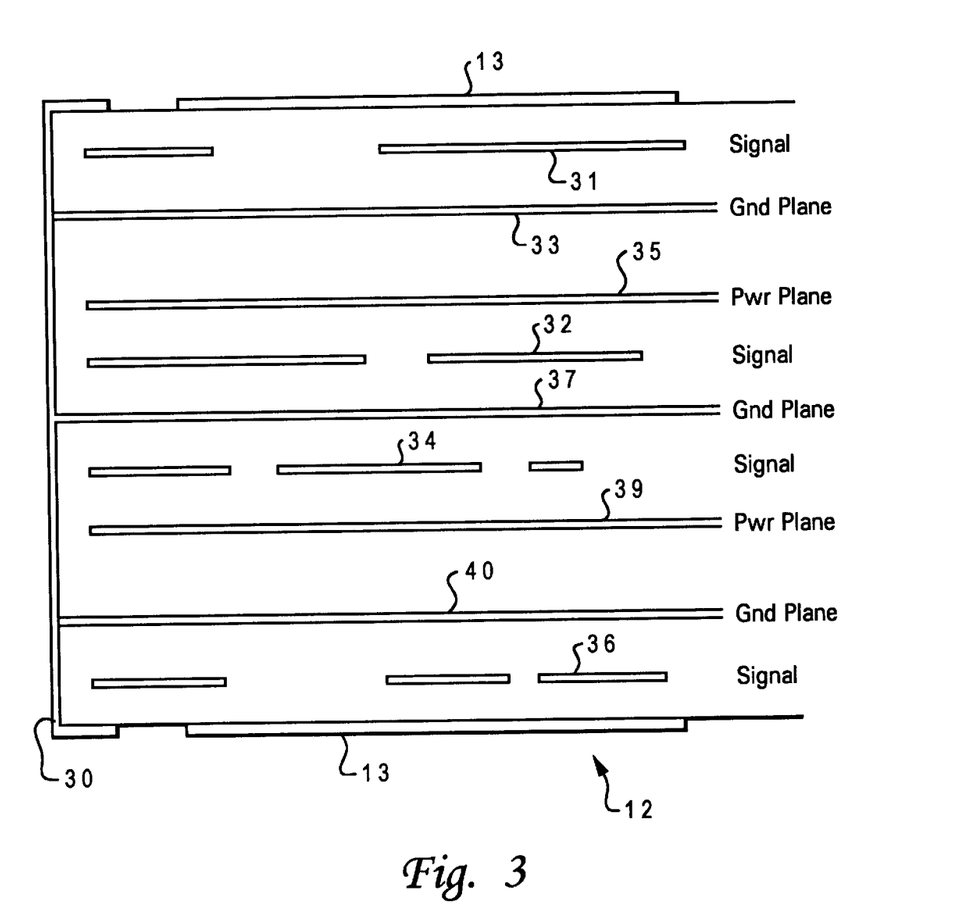
FIG. 3 is a cross section of the printed circuit board of FIG. 1.

FIG. 3 is a cross section of PCB 12 and shows contact tabs 13 on an exterior surface. Also, power or ground conductor 30 is shown fixed to contacting edge 29. Note that ground planes 33, 37, and 40 are shown attached to power and ground conductor 30. Power planes 35 and 39 are not attached in this particular circuit configuration. Signal lines 31, 32, 34, and 36 are shown between the power and ground planes. A 50 ohm impedance is sought, referring to Chart I, and illustrates the formulas for calculating the transmission line characteristic impedance.

Figure 4A:
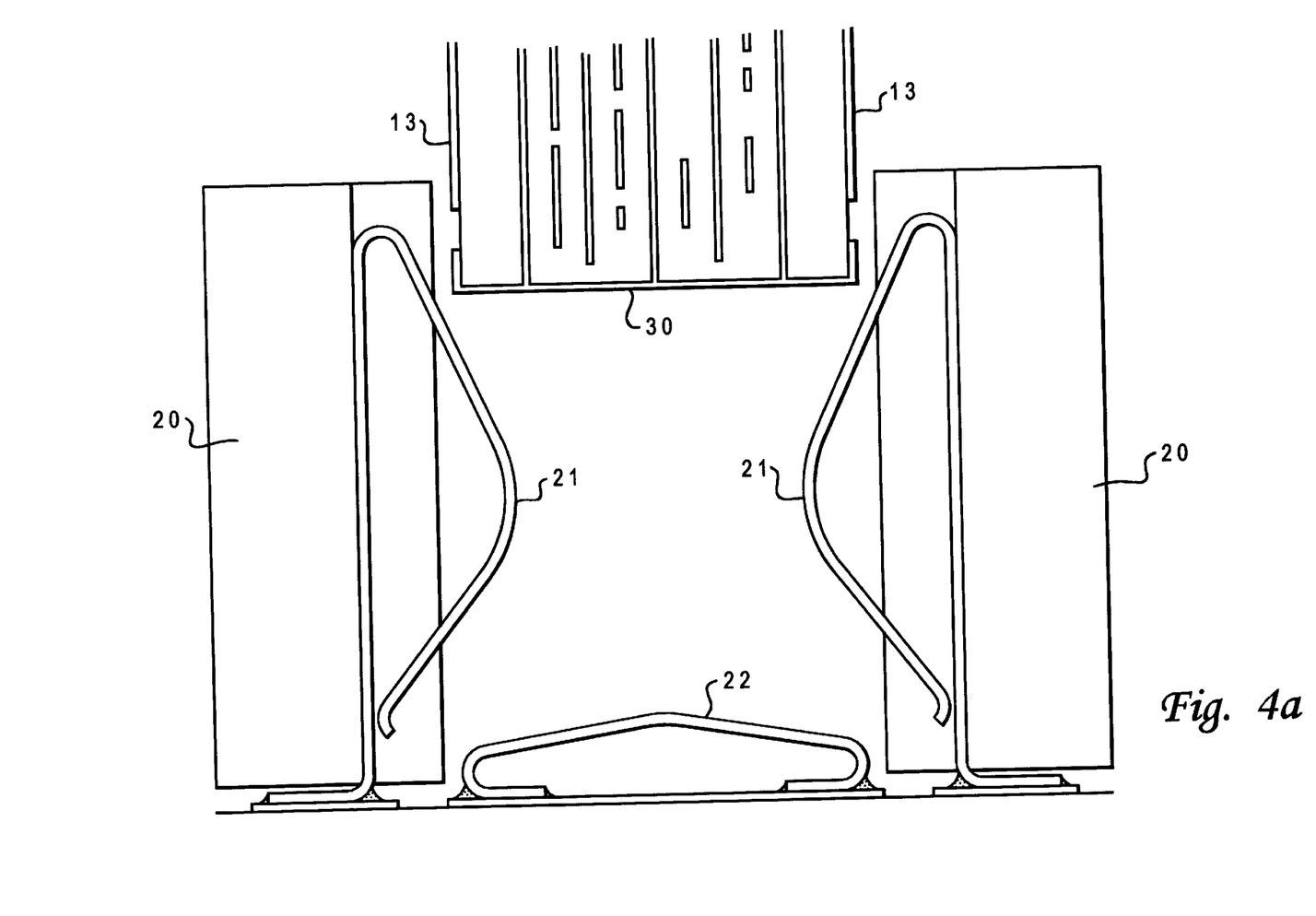
FIG. 4a illustrates printed circuit board 12 about to be inserted into connector 20.

FIG. 4a illustrates PCB 12 partially inserted into connector 20. Secondary contacts 17 are open.

Figure 4B:
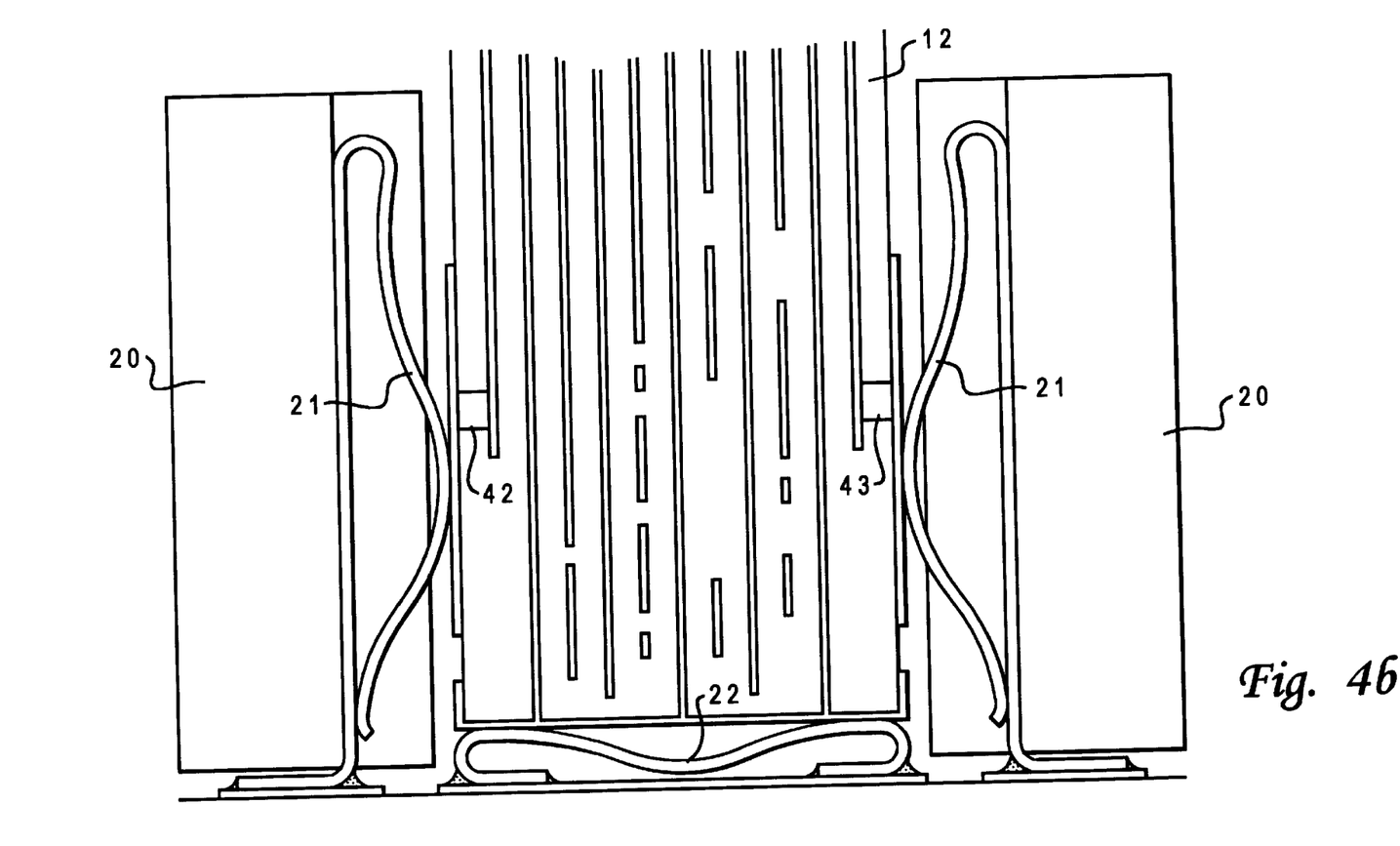
FIG. 4b illustrates printed circuit board 12 fully inserted into connector 20.

FIG. 4b illustrates PCB 12 fully inserted into connector 20 with contact tabs 13 in electrical communication with logic contactor 21. Further, ground conductor 30 is shown in electrical contact with ground contactor 22. At contact points 18, short-circuiting much of the current path through ground contactor 22 to minimize the length of the power and ground signal return paths formed by the power and ground conductors and the power and ground contactors. Secondary contacts 17 are closed, short circuiting much of the current path through contactors 21. Note that secondary contacts 17 are respectively positioned adjacent points 18 on ground contactor 22 to provide a desired transmission line characteristic impedance. Also shown, are plated through holes (vias) 42 and 43 connecting contact tabs 13 with signal lines 31, 36 respectively.

Figure 5:
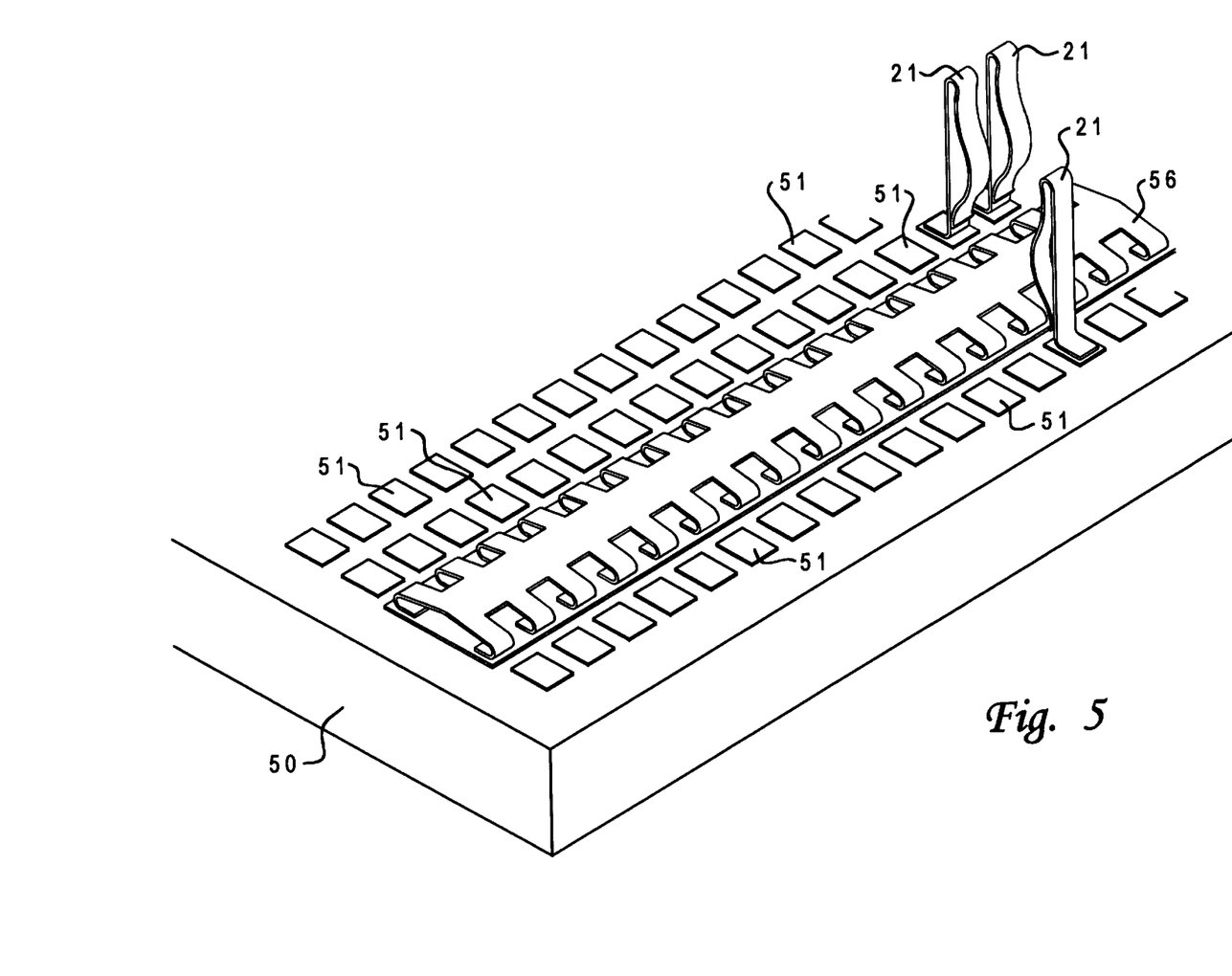
FIG. 5 is a perspective view of the power and ground contact attached to a multilayer backpanel.

FIG. 5 is a perspective view of a multilayer backpanel 50 having pads 51 for electrical connection to logic contactors 21 as shown. Power or ground contactor 22 as shown in FIGS. 1 and 2, is shown in contact with backpanel 50.

FIG. 6 is a chart illustrating microstrip and strip line intrinsic impedance.

MODE OF OPERATION

Referring first to FIG. 1, PCB 12 is shown in position to be inserted into connector 20. FIG. 4a illustrates PCB 12 partially inserted into connector 20. FIG. 4b shows the full insertion of PCB 12 into connector 20 with signal contact being made between logic contactors 21 and contact tabs 13, closing secondary contacts 17. Ground contactor 30 is shown contacting ground contactor 22.

The step of insertion results in the high frequency logic signals and the power and ground levels being transferred through connector 20 without significant degradation of the logic signals.

Those skilled in the art may change configurations and materials. However, such changes are contemplated and this invention is limited only by the appended claims.

What is claimed is:

1. An electric connection assembly for transmission of high speed signals and power and ground voltage levels from one point in an electrical circuit to another, comprising:

(a) a printed circuit board (PCB) having a contacting edge, at least one logic signal line, and at least one power and ground line, having a contact tab connected to the logic signal line, and power and ground conductors affixed to the contacting edge and electrically connected to the power and ground lines, the logic signal line and the power and ground lines being positioned to provide a desired transmission line impedance; and (b) a connector for receiving the PCB, the connector adapted to be mounted on a substrate and having at least one logic contactor for electrically connecting to the contact tab, the logic contactor being configured to firmly contact the contact tab and to the substrate to close a secondary contact of the logic contactor at a point on the logic contactor very near the substrate to minimize the length of the logic signal path formed by the contact tab and the contactor and the substrate, the connector having at least one power or ground contactor for electrically connecting to the power or ground conductor, and to the substrate the power or ground contactor being configured to firmly contact the power or ground conductor at a contact point on the power or ground contactor very near the substrate to minimize the length of the signal return path formed by the power or ground conductor and the power or ground contactor and the substrate, the logic contactor point and the power or ground contactor contact point being positioned adjacent each other to aid in maintaining the approximate desired transmission line impedance.

2. The assembly of claim 1 where in the logical contractor and the power and ground contractor are positioned on the connector to minimize the distance between the logic current path and the power or ground path when the PCB is inserted into the connector to maintain the approximate desired transmission line impedance.

3. The assembly of claim 2 wherein the logical contactor comprises a resilient material that is deformed by insertion of the PCB into the connector.

4. The assembly of claim 2 wherein the power or ground contactor comprises a resilient material that, upon insertion of the PCB into the connector, is deformed to provide the contact point.

5. The assembly of claim 3 wherein the resilient material comprises a spring contact alloy.

6. The assembly of claim 4 wherein the resilient material comprises a spring contact alloy.

7. The assembly of claim 2 wherein the desired transmission line impedance is 50 ohms.

8. An electrical connection assembly for transmission of high speed signals and power and ground voltage levels from one point in an electrical circuit to another, comprising:

(a) a multilayer printed circuit board (PCB) having a contacting edge, a plurality of logic signal lines, a plurality of power and ground lines, each of the plurality of logic signal lines having a contact tab connected thereto, and power and ground conductors affixed to the contacting edge and electrically connected to the power and ground lines; the logic signal lines and the power and ground lines being positioned to provide an approximate desired transmission line impedance; and (b) a connector for receiving the PCB, the connector adapted to be mounted on a substrate, the connector having a plurality of logic contactors, each logic contactor electrically connecting to a corresponding contact tab and to the substrate and being configured to firmly contact the corresponding contact tab to close a secondary contact at the logic contactors at a point on the logic contactor very near the substrate to minimize the length of each logic signal path formed by the corresponding contact tab and the corresponding contactor, and the substrate the connector having a plurality of power and ground contactors for electrically connecting to the power and ground conductors and to the substrate at a contact point very near the substrate to minimize the length of each of the signal return paths formed by the power and ground conductors and each corresponding power and ground contactor and the substrate, the logic contactor points and the power and ground contactor points being positioned adjacent each other to maintain an approximate desired transmission line impedance.

9. The assembly of claim 8 wherein the logic contactors comprise a resilient material that is deformed upon insertion of the PCB into the connector.

10. The assembly of claim 8 wherein the power or ground contactors each comprise a resilient material that, upon insertion of the PCB into the connector, is deformed to provide the contact point.

11. The assembly of claim 9 wherein the resilient material comprises a spring contact alloy.

12. The assembly of claim 10 wherein the resilient material comprises a spring contact alloy.

13. The assembly of claim 8 wherein the transmission line impedance is 50 ohms.

* * * * *